United States Patent
Pelton et al.

(10) Patent No.: US 10,810,343 B2
(45) Date of Patent: Oct. 20, 2020

(54) MAPPING SOFTWARE CONSTRUCTS TO SYNCHRONOUS DIGITAL CIRCUITS THAT DO NOT DEADLOCK

(71) Applicant: MICROSOFT TECHNOLOGY LICENSING, LLC, Redmond, WA (US)

(72) Inventors: Blake D. Pelton, Redmond, WA (US); Adrian Michael Caulfield, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/247,261

(22) Filed: Jan. 14, 2019

(65) Prior Publication Data

US 2020/0226227 A1    Jul. 16, 2020

(51) Int. Cl.
  *G06F 30/39*      (2020.01)
  *G06F 30/398*     (2020.01)
  *G06F 8/41*       (2018.01)
  *G06F 1/12*       (2006.01)

(52) U.S. Cl.
  CPC .............. *G06F 30/398* (2020.01); *G06F 1/12* (2013.01); *G06F 8/43* (2013.01)

(58) Field of Classification Search
  CPC ............ G06F 30/398; G06F 1/12; G06F 8/43
  USPC ................................ 716/104, 110, 111, 113
  See application file for complete search history.

(56) References Cited

U.S. PATENT DOCUMENTS

| | | | |
|---|---|---|---|
| 5,416,719 A | 5/1995 | Pribetich | |
| 5,761,483 A | 6/1998 | Trimberger | |
| 6,112,019 A * | 8/2000 | Chamdani et al. | ... G06F 9/3836 712/214 |
| 6,275,508 B1 | 8/2001 | Aggarwal et al. | |
| 6,597,664 B1 | 7/2003 | Mithal et al. | |
| 7,305,582 B1 * | 12/2007 | Moser et al. | ........... G06F 9/526 714/11 |
| 7,315,991 B1 | 1/2008 | Bennett | |
| 7,386,820 B1 | 6/2008 | Koelbl et al. | |

(Continued)

FOREIGN PATENT DOCUMENTS

| | | |
|---|---|---|
| WO | 2016094012 A1 | 6/2016 |
| WO | 2017084104 A1 | 5/2017 |

OTHER PUBLICATIONS

"Operand Forwarding", Retrieved From: https://en.wikipedia.org/w/index.php?title=Operand_forwarding&oldid=868126536, Retrieved on: Nov. 10, 2018, 2 Pages.

(Continued)

*Primary Examiner* — Sun J Lin

(74) *Attorney, Agent, or Firm* — Newport IP, LLC; David W. Foster

(57) ABSTRACT

A language disclosed herein includes a loop construct that maps to a circuit implementation. The circuit implementation may be used to design or program a synchronous digital circuit. The circuit implementation includes a hardware pipeline that implements a body of a loop and a condition associated with the loop. The circuit implementation also includes the hardware first-in-first-out (FIFO) queues that marshal threads (i.e. collections of local variables) into, around, and out of the hardware pipeline. A pipeline policy circuit limits a number of threads allowed within the hardware pipeline to a capacity of the hardware FIFO queues.

20 Claims, 8 Drawing Sheets

(56) References Cited

U.S. PATENT DOCUMENTS

| | | | |
|---|---|---|---|
| 7,516,446 B2* | 4/2009 | Choi et al. | G06F 9/52 717/119 |
| 7,647,567 B1 | 1/2010 | Esposito et al. | |
| 7,823,117 B1 | 10/2010 | Bennett | |
| 7,844,924 B2 | 11/2010 | Sasao et al. | |
| 8,468,510 B1 | 6/2013 | Sundararajan et al. | |
| 8,656,347 B2* | 2/2014 | Ito | G06F 8/456 717/106 |
| 8,671,371 B1 | 3/2014 | Dimond | |
| 8,775,986 B1 | 7/2014 | Mohan et al. | |
| 8,881,079 B1 | 11/2014 | Pan et al. | |
| 8,930,926 B2* | 1/2015 | Bastoul et al. | G06F 8/453 717/119 |
| 9,471,307 B2 | 10/2016 | Giroux et al. | |
| 9,690,278 B1 | 6/2017 | Chen et al. | |
| 9,824,756 B2 | 11/2017 | Brand et al. | |
| 9,846,623 B2* | 12/2017 | Jennings et al. | G06F 11/1679 |
| 9,858,373 B2 | 1/2018 | Cho et al. | |
| 10,331,836 B1 | 6/2019 | Hosangadi et al. | |
| 10,474,533 B2* | 11/2019 | Jennings et al. | G06F 11/1443 |
| 2002/0080174 A1 | 6/2002 | Kodosky et al. | |
| 2003/0154466 A1 | 8/2003 | Snider | |
| 2005/0050531 A1* | 3/2005 | Lee | G06F 11/3428 717/153 |
| 2006/0120189 A1 | 6/2006 | Beerel et al. | |
| 2007/0143717 A1 | 6/2007 | Koelbl et al. | |
| 2007/0174804 A1 | 7/2007 | Sasao et al. | |
| 2007/0300192 A1 | 12/2007 | Curtin et al. | |
| 2008/0005357 A1* | 1/2008 | Malkhi et al. | G06F 8/45 709/248 |
| 2008/0075278 A1 | 3/2008 | Gaubatz et al. | |
| 2009/0243732 A1 | 10/2009 | Tarng et al. | |
| 2012/0065956 A1 | 3/2012 | Irturk et al. | |
| 2013/0054939 A1 | 2/2013 | Felch | |
| 2013/0081060 A1 | 3/2013 | Otenko | |
| 2013/0111425 A1 | 5/2013 | Kumar et al. | |
| 2013/0111453 A1 | 5/2013 | Kalogeropulos et al. | |
| 2013/0125097 A1 | 5/2013 | Ebcioglu et al. | |
| 2013/0212365 A1 | 8/2013 | Chen et al. | |
| 2013/0298130 A1 | 11/2013 | Pienaar et al. | |
| 2015/0052298 A1 | 2/2015 | Brand et al. | |
| 2015/0178418 A1 | 6/2015 | Gu et al. | |
| 2015/0178435 A1* | 6/2015 | Kumar | G06F 30/394 716/114 |
| 2016/0180001 A1 | 6/2016 | Adler | |
| 2016/0299998 A1 | 10/2016 | Isshiki | |
| 2017/0192921 A1 | 7/2017 | Wang et al. | |
| 2018/0232475 A1 | 8/2018 | Derisavi et al. | |
| 2018/0253368 A1 | 9/2018 | Villarreal et al. | |
| 2018/0330022 A1 | 11/2018 | Choi et al. | |
| 2018/0342040 A1 | 11/2018 | Nguyen et al. | |
| 2019/0114548 A1 | 4/2019 | Wu et al. | |
| 2019/0138365 A1 | 5/2019 | Purnell et al. | |
| 2019/0303153 A1 | 10/2019 | Halpern et al. | |
| 2020/0225919 A1 | 7/2020 | Pelton et al. | |
| 2020/0225920 A1 | 7/2020 | Pelton et al. | |
| 2020/0225921 A1 | 7/2020 | Pelton et al. | |
| 2020/0226051 A1 | 7/2020 | Pelton et al. | |
| 2020/0226228 A1 | 7/2020 | Pelton et al. | |

OTHER PUBLICATIONS

"Register File", Retrieved From: https://en.wikipedia.org/w/index.php?title=Register_file&oldid=923242007, Retrieved on: Oct. 27, 2019, 8 Pages.

"Re-order Buffer", Retrieved From: https://en.wikipedia.org/w/index.php?title=Re-order_buffer&oldid=928835149 Retrieved on: Dec. 1, 2019, 1 Page.

"Non-Final Office Action Issued in U.S. Appl. No. 16/247,250", dated Dec. 27, 2019, 14 Pages.

"Non Final Office Action Issued in U.S. Appl. No. 16/247,269", dated Feb. 20, 2020, 14 Pages.

Cong, et al., "Combinational Logic Synthesis for LUT Based Filed Programmable Gate Arrays", In Proceedings of the ACM Transactions on Design Automation of Electronic Systems, Apr. 1996, pp. 145-204.

Tan, et al., "Mapping-Aware Constrained Scheduling for LUT-Based FPGAs", In Proceedings of the ACM/SIGDA International Symposium on Field-Programmable Gate Arrays, Feb. 22, 2015, 10 Pages.

"Final Office Action Issued in U.S. Appl. No. 16/247,250", dated Apr. 13, 2020, 22 Pages.

"International Search Report and Written Opinion Issued in PCT Application No. PCT/US2019/069030", dated Mar. 27, 2020, 11 Pages.

Ditmar, et al., "Function Call Optimisation in SystemC Hardware Compilation", In Proceedings of 4th Southern Conference on Programmable Logic, Mar. 26, 2008, pp. 93-98.

"International Search Report and Written Opinion Issued in PCT Application No. PCT/US2019/069028", dated Apr. 24, 2020, 13 Pages.

"International Search Report and Written Opinion Issued in PCT Application No. PCT/US2019/069031", dated May 4, 2020, 13 Pages.

"International Search Report and Written Opinion Issued in PCT Application No. PCT/US2019/069032", dated Apr. 24, 2020, 13 Pages.

"International Search Report and Written Opinion Issued in PCT Application No. PCT/US2020/012278", dated Apr. 6, 2020, 15 Pages.

Arar, Steve, "Concurrent Conditional and Selected Signal Assignment in VHDL", https://www.allaboutcircuits.com/technical-articles/concurrent-conditional-and-selected-signal-assignment-in-vhdl/, Jan. 3, 2018, 8 Pages.

Galloway, et al., "The Transmogrifier C hardware description language and compiler for FPGAs", In Proceedings IEEE Symposium on FPGAs for Custom Computing Machines, Apr. 19, 1995, pp. 136-144.

"International Search Report and Written Opinion Issued in PCT Application No. PCT/US2019/069034", dated Jun. 23, 2020, 19 Pages.

"Non-Final Office Action Issued in U.S. Appl. No. 16/247,181", dated Jul. 9, 2020, 11 Pages.

"Non Final Office Action Issued in U.S. Appl. No. 16/247,226", dated Sep. 4, 2020, 33 Pages.

\* cited by examiner

MAPPING SOFTWARE CONSTRUCTS TO SYNCHRONOUS DIGITAL CIRCUITS THAT DO NOT DEADLOCK

BACKGROUND

Hardware description languages ("HDLs") are modeling languages used by hardware engineers to describe the structure and behavior of electronic circuits, most commonly digital logic circuits. Examples of HDLs include Very High Speed Integrated Circuit ("VHSIC") HDL and VERILOG.

HDLs commonly require many lines of code to model digital logic circuits. Even for hardware engineers that are very familiar with HDLs, creation of such code can be extremely time consuming. Moreover, the more lines of code present in a design, the more likely it is for the design to include errors or perform poorly.

Because HDLs typically utilize a different programming paradigm than imperative programming languages, software engineers that are not intimately familiar with HDLs commonly have a very difficult time utilizing these languages. As a result, electronic circuits generated from HDL created by software engineers can also include errors or perform poorly.

It is with respect to these and other technical challenges that the disclosure made herein is presented.

SUMMARY

Technologies are disclosed for generating synchronous digital circuits ("SDCs") from source code constructs that efficiently map to circuit implementations. Through implementations of the disclosed technologies, hardware engineers can realize significant productivity gains by reducing the number of lines of code required to implement some types of SDCs compared to HDL-based solutions, and by eliminating whole classes of common design errors, while at the same time not sacrificing performance. For software engineers who have little or no experience with using HDLs to design SDCs, the disclosed technologies offer a familiar programming paradigm that can be used to quickly and easily generate high performance SDC designs. Technologies are also disclosed that generate circuits such that, if the software constructs described in the disclosed language do not cause a deadlock, then the generated circuit will not deadlock. Other technical benefits not specifically mentioned herein can also be realized through implementations of the disclosed subject matter.

In order to realize the technical benefits mentioned briefly above, program source code is generated in a multi-threaded imperative programming language and stored. The disclosed language is imperative in that program statements are executed one after another, and multi-threaded in that multiple threads of execution can be executing in parallel. A thread refers to a collection of local variables that are executed as the local variables are processed by a hardware circuit. Specific variables maintained in the collection may change as execution progresses, e.g. variables may be added to the collection as they are introduced by a function or removed from the collection when they are no longer referenced.

The threads described herein are analogous to, yet different from, software threads. While a software thread maintains a call stack containing local variables and executes code in memory, the threads described herein are collections of local variables that move through hardware circuits. While a software thread has a location in executable code determined by an instruction pointer, one of the disclosed threads has a physical location on an SDC at a given point in time. Additionally, the language constructs described herein map to circuit implementations that guarantee thread ordering (i.e. that threads will exit a circuit implementation in the same order that they entered).

The multi-threaded imperative programming language disclosed herein includes language constructs (or "constructs") that map to circuit implementations. A language construct is a syntactically allowable part of a program that may be formed from one or more lexical tokens. The circuit implementations can be implemented as an SDC, such as a field-programmable gate array ("FPGA"), a gate array, an application-specific integrated circuit ("ASIC"), or another type of suitable device. Computer devices powered by a central processing unit ("CPU") can be configured with an SDC in order to augment functionality. For example, a computing device may include an FPGA configured to perform the functionality of a network interface card ("NIC") in a virtualized environment.

In one configuration, a language construct includes a loop statement, such as a "for" loop, that executes a block of code multiple times. An example "for" loop is "for(int i=1; i<z; i++) {y=y+i}". Loops typically include a body (e.g. "{y=y+i}") that executes while a condition (e.g. "i=1 to z") is true. In this configuration, the construct maps to a circuit implementation that includes a hardware pipeline (or "pipeline") that implements the loop's body and condition. The pipeline may include multiple stages, each of which executes in a single clock cycle. The circuit implementation also includes hardware first-in-first-out queues (referred to as "FIFOs" or "queues") that marshal threads (i.e. collections of local variables) into, around, and out of the pipeline.

In some configurations, a first queue provides initial collections of local variables to the pipeline, e.g. collections including the initial value of 'y' and the value of 'z'. A second queue stores collections of local variables produced by the pipeline that will be provided back to the pipeline for subsequent iterations, such as updated values of 'i' and 'y'. Once the loop's condition evaluates to false (e.g. when T is greater than 'z'), the loop ends, and any local variables used by a subsequent pipeline are placed in a third queue.

In some configurations, SDCs execute threads in parallel. While a given pipeline stage executes at most one thread per clock cycle, different pipeline stages may execute different threads in the same clock cycle. In this way, multiple threads may be "in flight" in a pipeline at the same time. Similarly, multiple threads may be pushed onto a queue at the same time, waiting in turn to be processed. When both the first and second queues have threads available for processing, a policy circuit included in the pipeline chooses which queue to pull a thread from.

Queues, however, have limited capacity, and loop constructs can create a deadlock if the second queue is full when the pipeline attempts to push another thread onto it. So, in some configurations, the pipeline policy circuit limits the number of threads allowed within the pipeline to the capacity of the second queue. In this way, every thread that has been allowed into the pipeline, but hasn't yet exited, will fit into the second queue—i.e. there will not be a thread in the pipeline that can deadlock trying to enter the second queue. For example, if a queue has the capacity for five threads, then the policy circuit will not allow a sixth thread into the pipeline until one of the five threads exits. As a thread exits the loop—e.g. when the loop condition evaluates to false, such that the thread proceeds beyond the loop statement— the policy circuit may decrement the thread count such that a new thread will be allowed to enter.

Deadlocks are possible with loop constructs because a loop creates a cycle in the call graph—i.e. a thread may enter a pipeline, continue executing in other pipelines and/or queues, and then enter the pipeline a second time. However, other constructs create call graph cycles. For example, if a first function calls a second function twice, a cycle is formed by the first invocation of the second function, the return to the first function, and the second invocation of the second function. Specifically, if function 'f( )' calls function 'g( )' twice, a first queue passes arguments to 'g( )', a second queue passes return values back to 'f( )', and a third queue passes parameters to 'g( )' for the second invocation. If the policy circuit associated with 'g( )' continues to accept more threads from the first queue than the third, threads will accumulate in the third queue until a deadlock occurs.

Regardless of how call graph cycles are constructed, some configurations eliminate the possibility of deadlock by limiting the number of threads allowed in the pipeline to the capacity of the queue that acts as a "back-link", i.e. the queue that allows the thread to re-enter a pipeline. If multiple queues allow a thread to re-enter a pipeline, the policy circuit will limit the number of threads to the smallest queue's capacity.

Once program source code has been defined having a construct that maps to a circuit implementation, the source code, including the construct, can be compiled to generate a circuit description. The circuit description can be expressed using HDL, for instance. The circuit description can, in turn, be used to generate an SDC that includes the circuit implementation. For example, HDL might be utilized to generate an FPGA image or bitstream that includes the circuit implementation defined by the construct. The FPGA image or bitstream can, in turn, be utilized to program an FPGA that includes the circuit implementation.

As discussed briefly above, implementations of the technologies disclosed herein enable generating circuits that, if the software constructs described in the disclosed language do not cause a deadlock, then the generated circuit will not deadlock. Placing limits on the number of threads allowed to concurrently execute within a pipeline that implements the software constructs avoids the possibility of a deadlock. Implementations of the technologies disclosed herein also enable hardware and software engineers alike to easily and quickly generate certain performant and reliable SDC implementations using programming constructs that map to the SDC implementations. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
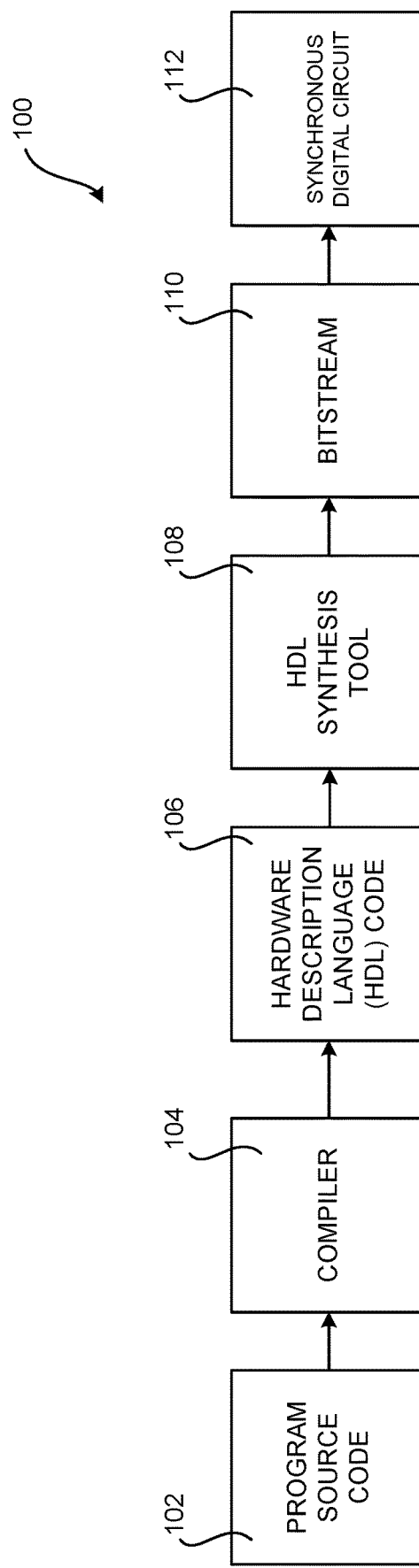
FIG. 1 is a computing architecture diagram that shows aspects of a system disclosed herein for generating a synchronous digital circuit based on program source code that includes a programming construct that maps to the synchronous digital circuit.

The following detailed description is directed to a language and compiler that generate circuits that do not deadlock. As discussed briefly above, certain software constructs map to circuit implementations that may cause deadlocks when implemented on a synchronous digital circuit. Placing limits on the number of threads allowed to concurrently execute within a pipeline that implements the software constructs avoids the possibility of a deadlock. Other technical benefits not specifically mentioned herein can also be realized through implementations of the disclosed subject matter.

While the subject matter described herein is presented in the general context of a language and compiler that generate circuits that do not deadlock, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a language and compiler that generate circuits that do not deadlock will be described.

FIG. 1 is a computing architecture diagram that shows aspects of an illustrative system 100 disclosed herein for defining and generating a synchronous digital circuit ("SDC") 112 based on program source code 102 that includes a programming construct that maps to the SDC 112. SDCs 112 can be implemented by Gate Arrays, Field Programmable Gate Arrays ("FPGAs"), Application Specific Integrated Circuits ("ASICs"), and other types of circuit devices. While the disclosed subject matter is primarily described in the context of an SDC 112 implemented in an FPGA, it is to be appreciated that the technologies disclosed herein can be utilized to define SDCs 112 that are implemented using other types of devices.

As illustrated in FIG. 1, the illustrative system 100 includes a compiler 104 that compiles program source code 102 to generate hardware description language ("HDL") code 106 or a lower-level representation of a circuit, such as a netlist. As discussed briefly above, HDLs are modeling languages used by hardware engineers to describe the structure and behavior of electronic circuits, most commonly digital logic circuits. Examples of HDLs include VHSIC HDL and VERILOG.

As will be described in detail below, the program source code 102 is expressed using a multi-threaded imperative programming language designed to target SDCs 112. The disclosed language provides many of the features of languages such as 'C' and 'JAVA, such as function calls, for-loops, arithmetic operators, and conditional statements. However, the disclosed language includes constructs that map directly to an underlying SDC 112 hardware implementation. This enables both hardware and software engineers to reason about performance, and to be effective in optimizing their designs. As mentioned above, this can also make the language familiar to software engineers, and free hardware engineers from dealing with whole classes of bugs that arise when coding in an HDL.

The disclosed multi-threaded imperative programming language is imperative, in that program statements are executed one after another, and multi-threaded in that multiple threads of execution can be executing in parallel. As discussed above, a thread is a collection of local variables. Threads are executed as the local variables are processed by a hardware circuit.

The threads described herein are analogous to, yet different, from software threads. While a software thread maintains a call stack containing local variables and executes code in memory, the threads described herein are collections of local variables that move through hardware circuits. While a software thread has a location in executable code determined by an instruction pointer, the disclosed thread has a physical location on the SDC at a given point in time. SDCs may execute hundreds, thousands, or even millions of threads, and SDC execution may be pipelined—i.e. different threads may execute within different stages of a circuit at the same time.

As will be described in greater detail below, language constructs can be defined in the program source code 102 that map to a circuit implementation. A language construct is a syntactically allowable part of a program that may be formed from one or more lexical tokens. The language constructs described herein map to circuit implementations that guarantee thread ordering (i.e. that threads will exit a circuit implementation in the same order that they entered).

As will also be described in greater detail below, the circuit implementations generated by the constructs disclosed herein can be implemented as an SDC in an FPGA, a gate array, an ASIC, or another type of suitable device. Another hardware component, such as a NIC, can be configured with the FPGA, gate array, or ASIC, in order to implement desired functionality.

As shown in FIG. 1, a compiler 104 can compile the program source code 102 including one or more of the language constructs disclosed herein to a circuit description, HDL code 106 in this example. The HDL code 106 can be provided to an HDL synthesis tool 108 which, in turn, can generate a bitstream 110 that can be utilized to program an SDC 112, such as for instance on an FPGA. When targeting an ASIC, the HDL code 106 can be provided to an ASIC fabricator for production in a factory.

Figure 2:
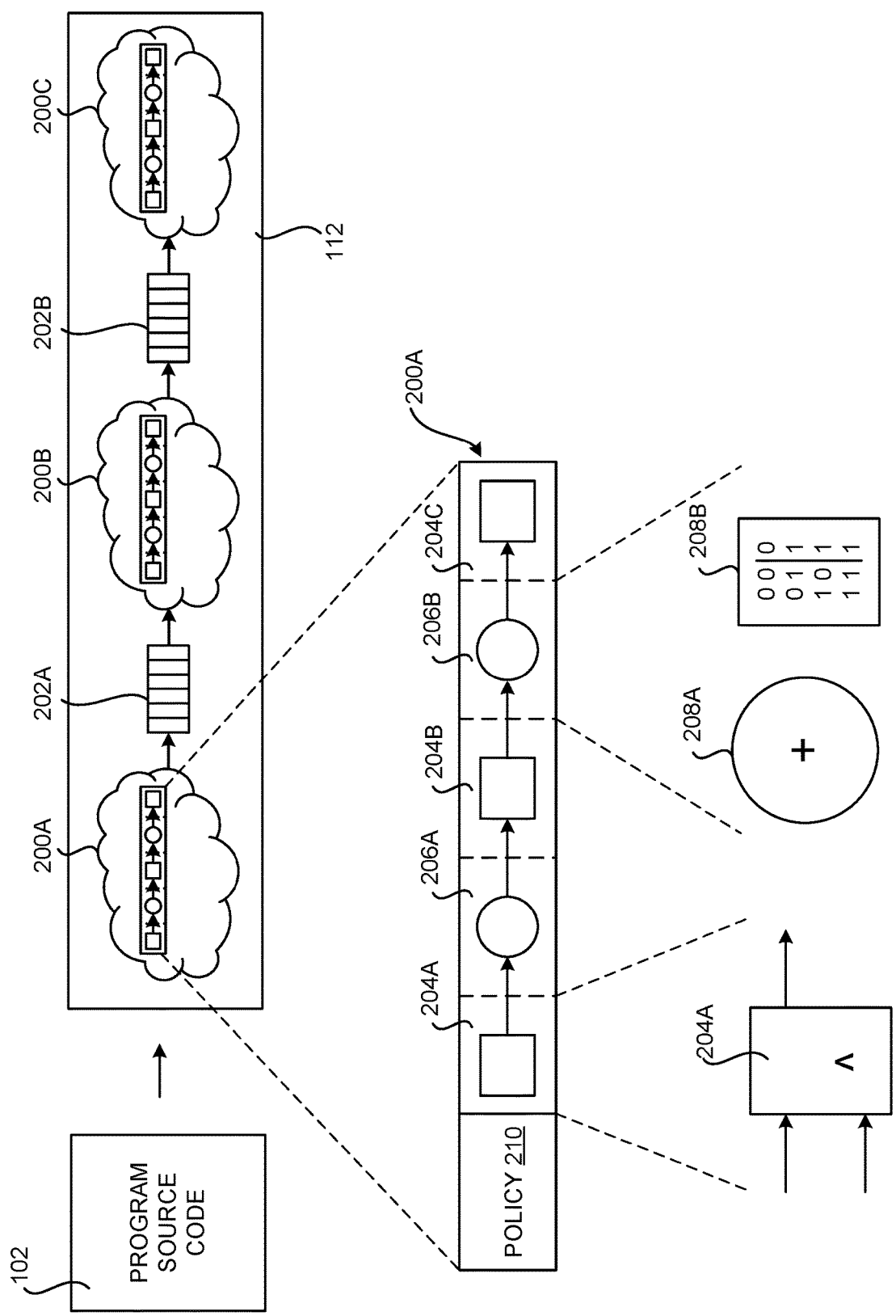
FIG. 2 is a hardware architecture diagram showing aspects of an illustrative example synchronous digital circuit, that includes several hardware pipelines, each having multiple pipeline stages, and computational units that can be defined and implemented using the disclosed technologies.

FIG. 2 is a hardware architecture diagram showing aspects of an illustrative example SDC 112 that includes several hardware pipelines 200A-200C (or "pipelines") that can be defined and implemented using the disclosed technologies. Each hardware pipeline has multiple pipeline stages 206, each of which has computational units 208. As shown in FIG. 2, the program source code 102 can be compiled into pipelines 200A-200C of hardware computational units 208.

The pipelines 200A-200C can be connected by first-in-first-out ("FIFO") queues (which might be referred to herein as "FIFOs" or "queues"). The pipelines 200A-200C implement the functionality defined by the program source code 102. The FIFOs 202 store data values, providing input to pipelines 200 as well as storing output generated by pipelines 200. For example, the SDC 112 includes a pipeline 200A that feeds its output to the FIFO 202A. Pipeline 200B, in turn, obtains its input from the FIFO 202A and provides its output to the FIFO 202B. The pipeline 200C obtains its input from the FIFO 202B.

In some configurations, the pipelines 200 implement a policy circuitry 210 that determines when to retrieve the next value(s) from a FIFO 202. For example, policy circuit 210 may require that an input FIFO (e.g. the FIFO 202A in the case of the pipeline 200B) is not empty and an output FIFO (e.g. the FIFO 202B) is not full before retrieving a value from the input FIFO (e.g. the FIFO 202A) for processing.

As shown in FIG. 2, a pipeline 200 may consist of one or more pipeline stages 206A-206B. Execution is pipelined by executing different threads in different stages 206 of a pipeline 200 concurrently. The results of stages can be stored in registers 204 and provided to the next stage 206 for the duration of the next clock cycle.

Each pipeline stage 206 can include one or more computational units 208, such as adder 208A and lookup table ("LUT") 208B. In the illustrated example, adder 208A can perform basic arithmetic, e.g. addition, subtraction, or multiplication. Computational units can also implement Boolean operators (e.g. "OR", "NOR", "XOR", etc.) or other custom logic provided by the SDC manufacturer.

Computational units can also be implemented by user-programmable lookup tables 208B. The illustrated LUT 208B depicts a two-input truth table that maps two input bits to a single output bit. LUTs 208B can be configured to support different numbers of input bits. To generate more complex output values, e.g. characters or 8-bit integers, multiple LUTs 208B, each connected to a different bit of an input variable, may be used.

Computational units can temporarily store results in registers 204 (or "flip-flops"). The contents of such a register can be provided to other computation units in the same or different pipeline 200. Registers 204 can capture a value at an input when a connected digital clock transitions from 0 to 1, and provide that value at an output until the end of the next clock cycle (i.e. until the clock transitions from 0 to 1 again). Registers can also include an enable line. If an enable line is set to false, then the register will not perform the operations described above, maintaining the current output value over multiple clock cycles.

It is to be appreciated that the pipeline architecture shown in FIG. 2 has been simplified for discussion purposes. The programming language constructs described herein can be utilized to implement much more complex SDCs 112 that include many more components than illustrated in FIG. 2.

Figure 3:
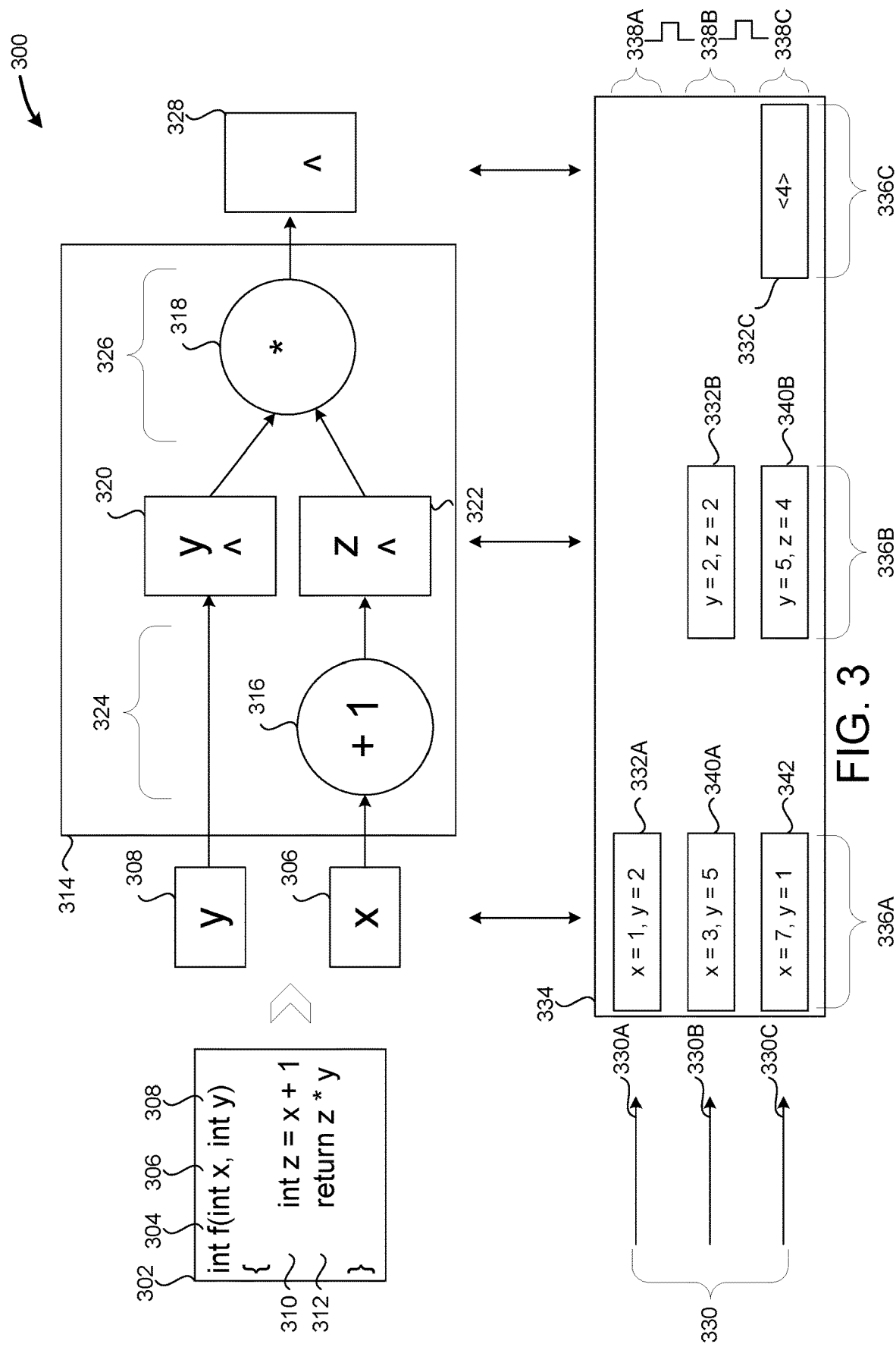
FIG. 3 is a hardware architecture diagram that shows mapping a function written in the disclosed language to a hardware circuit.

FIG. 3 is a hardware architecture diagram 300 that shows mapping a function written in the disclosed language to a hardware circuit, according to one embodiment. Program source code 302 includes a function 'f( )' 304 written in the disclosed language. The disclosed language is imperative, in that program statements are executed one after another, and multi-threaded in that multiple threads of execution can be executing in parallel and/or concurrently. Function 'f( )' 304 takes two parameters, 'x' 306 and 'y' 308, and returns an integer. Function 'f( )' 304 has two expressions: expression 310 performs an addition and stores the result in local variable 'z', while expression 312 returns the result of a multiplication.

Function 'f( )' is 304 mapped to a hardware circuit 314, which includes computational units 316 and 318 and registers 320 and 322. Hardware circuit 314 has two stages—a first stage 324 that performs the addition described in expression 310, and a second stage 326 that performs the multiplication described in expression 312. Each stage is executed in a single clock cycle, and the result of each stage is stored in one or more registers.

Continuing the example, stage 324 performs a "+1" operation on parameter 'x' 306, storing the result ('z') in register 322. During stage 324, parameter 'y' 308 is provided to register 320 directly. During stage 326, computational unit 318 multiplies the values of 'y' and 'z'. The result is stored in register 328.

Hardware circuit 314 may be executed by threads 330, only some of which are depicted. SDCs may execute hundreds, thousands, or millions of threads. A thread refers to a collection of local variables. Threads are executed as the local variables are processed by a hardware circuit. For example, thread 330A has the values 332 (x=1 and y=2), and thread 330A executes function 'f( )' 304 as the values 332 are processed by hardware circuit 314. Values returned by a function may be added to a set of local variables, and at any time if it is known that a particular variable will no longer be used by a hardware circuit, that variable may be removed from the set of local variables.

The disclosed threads are analogous to, yet different, from software threads. While a software thread maintains a call stack containing local variables and executes code in memory, the disclosed thread is a collection of local variables that moves through hardware circuits. While a software thread has a location in executable code determined by an instruction pointer, the disclosed thread has a physical location on the SDC at a given point in time.

SDC execution may be pipelined—i.e. different threads may execute within different stages of a circuit at the same time. Table 334 depicts variables from different threads in different stages as pipelined execution of hardware circuit 314 occurs. Columns 336 display values stored between (i.e. before and after) stages: 336A contains values of x and y provided by threads 330A, 330B, and 330C, while column 336B contains values after stage 324 has been executed and column 336C contains values after stage 326 has been executed. Rows 338A-C display values stored after successive clock cycles.

For instance, row 338A indicates that thread 330A is about to enter hardware circuit 314 with the values 332A (x=1 and y=2). Between rows 338A and 338B, a clock cycle occurs, and the results of executing thread 330A in stage 324 are depicted in 332B (y=2, a holdover from 332A, and z=2, the result of the "+1" operation). At the same time, the values 340A from thread 330B (x=3 and y=5) are about to enter hardware circuit 314. Between rows 338B and 338C another clock cycle occurs, and the result of thread 330A executing stage 326 is depicted in 332C ("4"). At the same time, the result of thread 330B executing stage 324 is depicted in 340B (y=5 and z=4), and the values 342 from thread 330C are about to enter hardware circuit 314 (x=7 and y=1). Pipelined execution enables higher throughput by increasing SDC utilization—i.e. more of the SDC is performing useful work at a given point in time than if only one thread at a time could execute hardware circuit 305.

Figure 4:
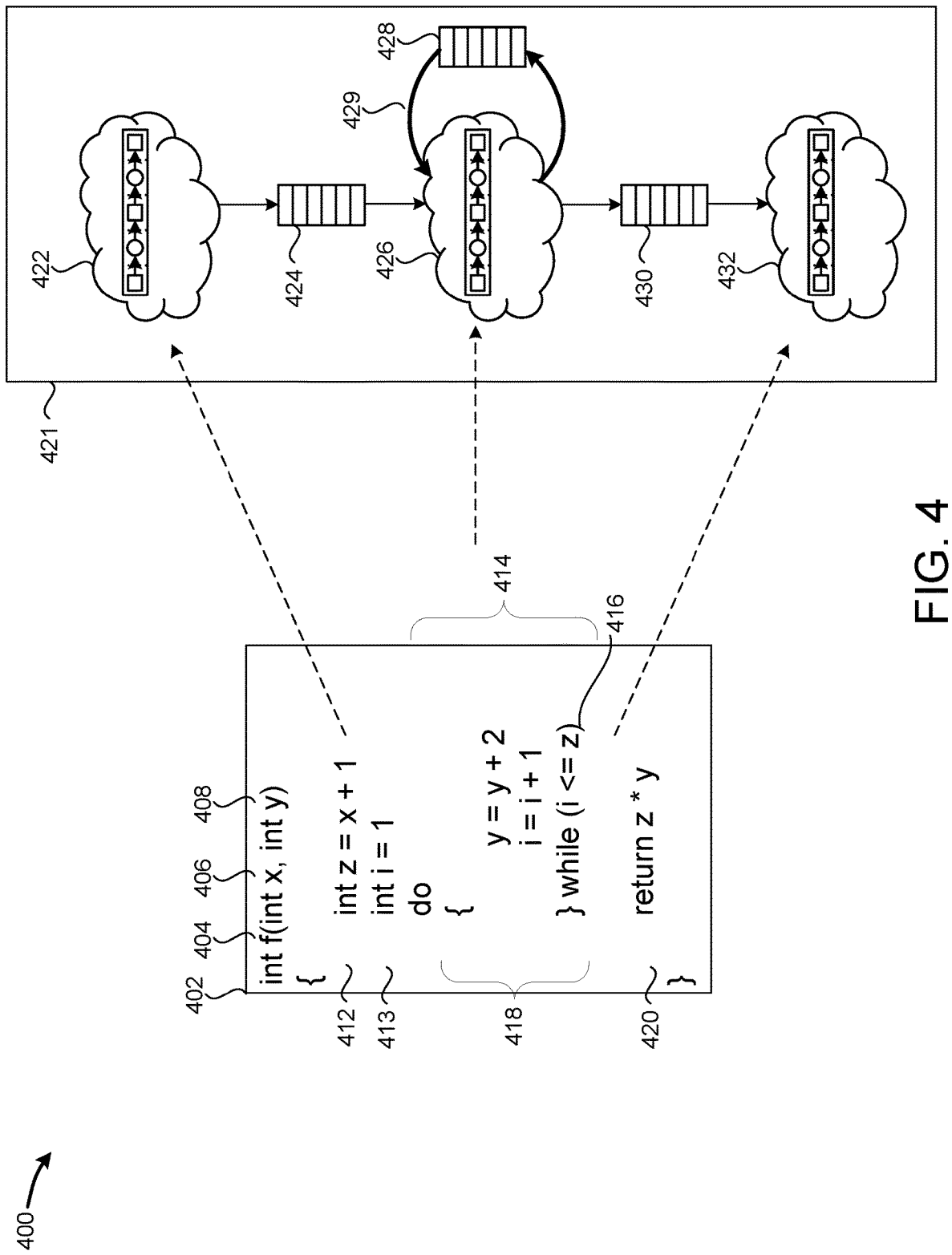
FIG. 4 is a hardware architecture diagram that shows mapping a loop construct to a hardware circuit.

FIG. 4 is a hardware architecture diagram 400 that shows mapping a loop construct to a hardware circuit. Code listing 402 includes function 'f( )' 404 that takes parameters 'x' 406 and 'y' 408. Line 412 initializes int 'z' to be "x+1", and corresponds to execution pipeline 422. Specifically, execution pipeline 422 includes a "+1" computational unit, which adds '1' to the value of 'x' 406. Line 413 initializes the value of T, the loop's counter variable, to '1'. Pipeline 422 concludes by pushing the values T, 'y' and 'z' into queue 424.

Loop statement 414 includes condition 416 and body 418, and corresponds to execution pipeline 426. While FIG. 4 depicts a "do-while" loop, any kind of loop or other iterative programming construct is similarly contemplated, including a while loop, for loop, for each loop, tail recursion, or the like. Condition 416 determines when loop 414 ends—e.g. when T greater than 'z' is true. However, in other configurations, loop conditions may determine a loop ends when a condition evaluates to false, or any other value.

Body 418 includes one or more statements, e.g. "y=y+2" that may execute more than once. Local variables may enter the first iteration of body 418 with an initial value supplied by queue 424. For example, if function 'f( )' was called with a value of 'x'='1' and 'y'='4', then the initial value of 'z' passed to body 418 would be '2', while the initial value of 'y' would be '4'.

Return statement 420 is the first statement to execute after loop 414. Return statement 420 maps to execution pipeline 432. In some configurations, return statement 432 is supplied with a thread by queue 430.

In some configurations, circuit implementation 421 defines an arrangement of circuit components generated by the disclosed compiler. For example, pipeline 422 provides threads to pipeline 426 through queue 424. In some configurations, queue 424 provides an initial value, such as the value of 'z', to pipeline 426. Pipeline 426, which executes the body of loop 414, contains a policy circuit 210 that determines when to retrieve a thread, and which queue to retrieve it from. For example, policy circuit 210 may alternate selecting threads from queue 424 and queue 428. In other configurations, policy circuit 210 may prioritize threads from one queue or the other.

In some configurations, pipeline 426 makes a determination after executing each iteration of body 418 whether to continue looping or not. In some configurations, the determination is made based on condition 416. If condition 416 evaluates to determine that loop 414 should execute at least one more time, then the currently executing thread is placed on queue 428. Once this thread arrives at the head of queue 428, policy circuit 210 of pipeline 426 may retrieve it and process it, continuing the execution of loop 414. This code path creates a call graph cycle 429, as indicated by the bolded execution path from pipeline 426 to queue 428 and back to pipeline 426. In some configurations, when queue 428 supplies a thread to pipeline 426, queue 428 is operating as "back-link".

However, if condition 416 determines that the loop has ended (e.g. if 'i' is greater than 'z'), then a collection of parameters used by the next statement after the loop (e.g. statement 420) are provided to queue 430 for use by pipeline 432.

In some embodiments, in order to prevent threads from overflowing queue 428 and causing a deadlock, policy circuit 210 of pipeline 426 limits the number of threads allowed into pipeline 426. A thread is considered to have exited pipeline 426 when it is added to a queue that is not part of a call graph cycle that leads, directly or indirectly, back to the beginning of pipeline 426. For example, if a thread is added to a 'back-link', such as queue 428, it is still considered within the pipeline. In some configurations, policy circuit 210 limits the number of threads within a pipeline to the capacity of the back-link. For example, if back-link queue 428 has a capacity for six threads, policy circuit 210 will allow up to six threads into pipeline 426. In this way, even if all six threads are stored in queue 428, there will not be a seventh thread within pipeline 426 that will deadlock when the pipeline attempts to add it to queue 428.

Figure 5:
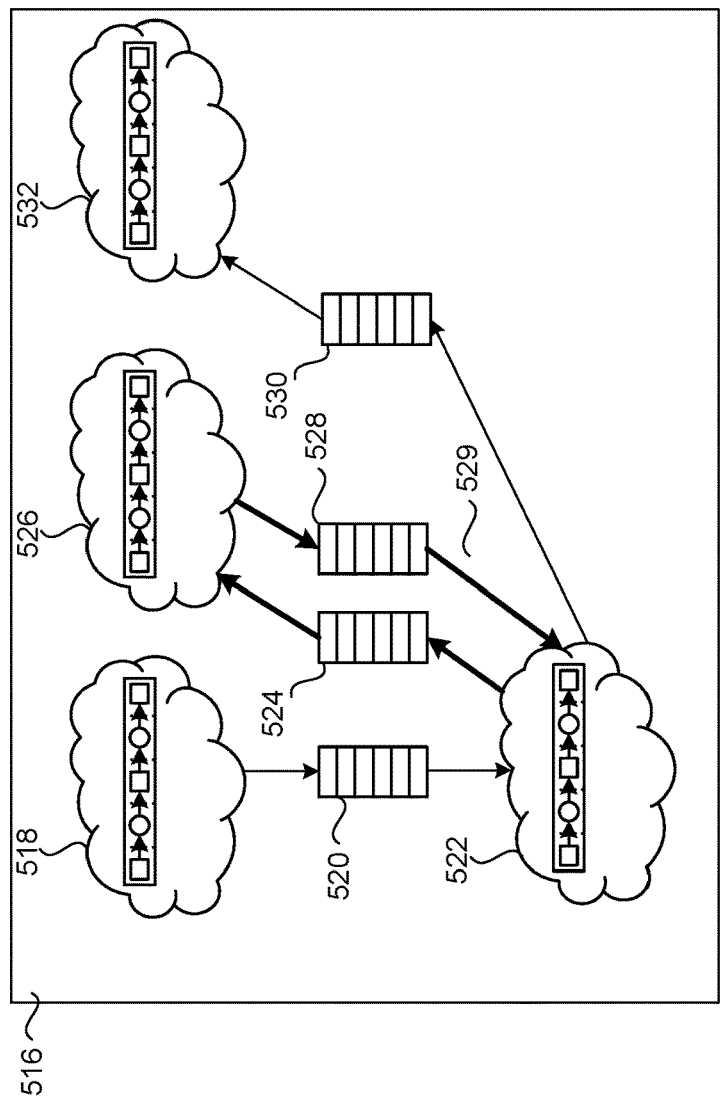
FIG. 5 is a hardware architecture diagram that shows mapping a function that calls a second function twice to a hardware circuit.

FIG. 5 is a hardware architecture diagram 500 that shows mapping a function that calls a second function twice to a hardware circuit. Circuit implementations that follow this pattern include a call graph cycle, and as such are prone to deadlocks for the same reasons discussed above with regard to loop constructs. Specifically, without limiting the number of threads allowed to enter a pipeline that receives threads from two queues, one of which is a backlink queue, the backlink may overflow. A backlink queue is a queue that can supply a thread to a pipeline a second time (or any number of subsequent times). A backlink queue can overflow, and eventually deadlock, because the pipeline may continue to allow new threads into a pipeline while existing threads continue to execute within the pipeline via the backlink. Deadlocks occur when the pipeline attempts to push a thread onto a backlink that is full.

Code listing 502 includes function 'f( )' 504 that takes parameter 'x' 506. Statement 508 invokes function 'g( )' 512 for a first time, passing in the parameter 'x' 506. Statement 510 invokes function 'g( )' 512 for a second time, while statement 511 returns a value from function 'f( )' 504. Function 'g( )' 512 takes one parameter, p', and statement 514 returns the square of 'p'.

Circuit implementation 516 enables function 'f( )' 504 to call function 'g( )' 512 by breaking 'f( )' 504 up into multiple pipelines. Pipeline 518 implements statement 508, although any number of statements that execute before invoking function 'g( )' 512 could similarly be implemented in pipeline 518. Pipeline 526 implements statement 510, and pipeline 532 implements statement 511. Pipeline 522 implements both invocations of function 'g( )' 514.

Each pipeline passes threads to another pipeline using queues, e.g. queue 520, which is used to pass values from pipeline 518 to pipeline 522. Queue 524 passes a return value from the first invocation of function 'g( )' to the subsequent portion of function 'f( )' (e.g. statement 510). Queue 528 passes a second collection of parameters from function 'f( )' 504 to function 'g( )' 512, creating a call graph cycle 529 in conjunction with queue 524 (as indicated in FIG. 5 with bolded arrows). Queue 528 is a backlink because execution passes back to a pipeline (522) the thread has already executed at least once. Finally, the result of the second invocation of function 'g( )' 512 is returned through queue 530 to pipeline 532.

In some configurations, compiler 104 sets policy circuits 210 of pipeline 522 to limit the number of concurrent threads executing within pipeline 522 to the capacity of backlink queue 528. In other configurations, compiler 104 sets the capacity of backlink queue 528 to a known maximum number of threads that can enter pipeline 522 at once.

Figure 6:
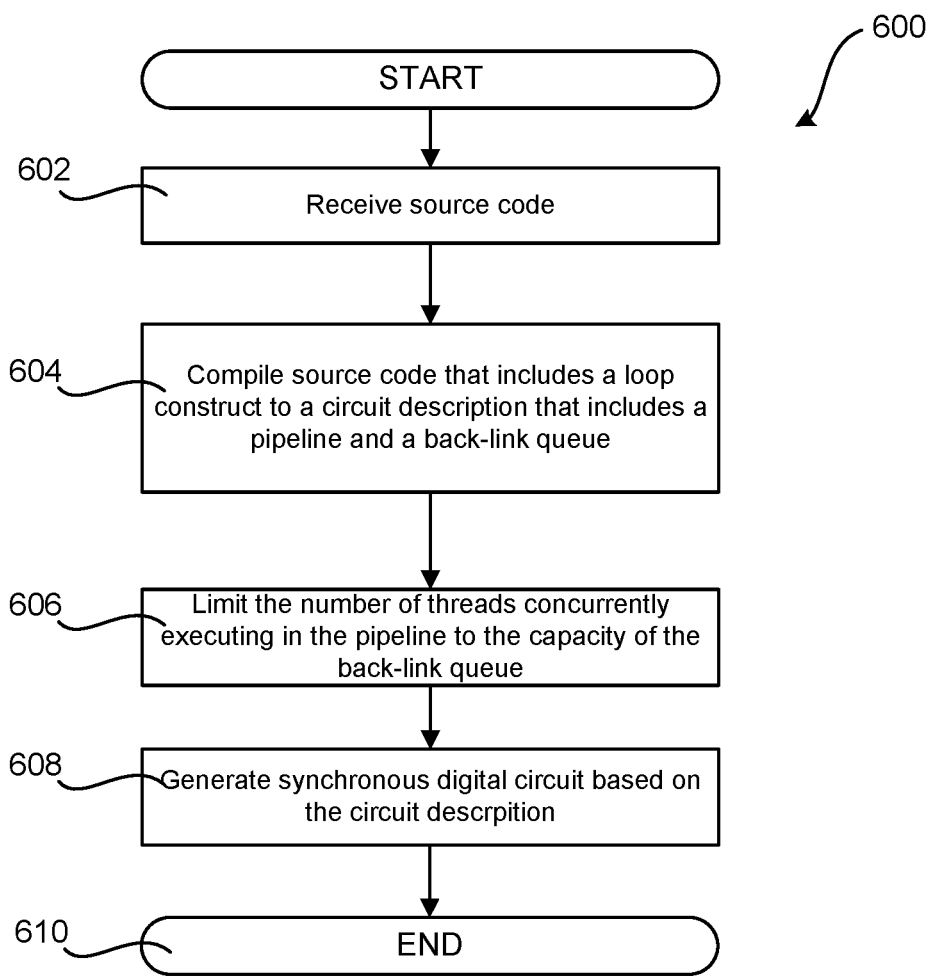
FIG. 6 is a flow diagram showing a routine that illustrates aspects of the operation of the language and compiler that generate circuits that do not deadlock described with reference to FIGS. 1-5.

FIG. 6 is a flow diagram showing a routine 600 that illustrates aspects of the language and compiler that avoids deadlocks illustrated in FIGS. 1-5 and described above, according to one embodiment disclosed herein. It should be appreciated that the logical operations described herein with regard to FIG. 6, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 600 begins at operation 602, where source code 102 is received by a compiler 104. The source code 102 may be expressed in a multi-threaded programming language. In some configurations, the source code is expressed in an imperative programming language, although functional languages and other types of programming languages are similarly contemplated. In some configurations, the source code 102 includes a loop statement 414, such as 'for' or 'while' statement, that causes a thread 330A to execute a code path multiple times. Additionally, or alternatively, the source code 102 may include a first function 504 that invokes a second function 512 twice.

From operation 602, the routine proceeds to operation 604, where the compiler 104 compiles the source code 102 to a circuit description 421. In some configurations, when the source code 102 includes a loop construct 414, the circuit description 421 implements a loop in hardware as discussed above in conjunction with FIG. 4. Additionally, or alternatively, when the source code 102 includes a first function 504 that calls a second function 512 twice, the circuit description 516 implements the invocations in hardware as discussed above in conjunction with FIG. 5 In some configurations, loops 414 and functions that call another function twice 504 are implemented with a call graph cycle 429, i.e. with queues that store threads for processing by a pipeline a second (or subsequent) time.

From operation 604, the routine 600 proceeds to operation 606, where the compiler 104 limits a number of threads 330 allowed to concurrently execute in a pipeline 426 that is part of a call graph cycle 429, 526. In some configurations, the compiler 104 generates a policy circuit 210 that limits the number of threads 330 concurrently executing in the pipeline 426, 520 to a capacity of a 'back-link' queue 428, 528 used to supply threads back to the pipeline 426, 520. In configurations where more than one queue is used to supply threads to the pipeline, the limit may be set to the capacity of the lowest capacity queue.

Additionally, or alternatively, the compiler 104 may know the maximum number of threads 330 that can be executing in a particular pipeline concurrently, e.g. based on a user setting, based on a code analysis, etc. When the maximum number of threads is known, the compiler 104 may size back link queues (e.g. 428 & 528) to the identified maximum.

From operation 606, the routine 600 proceeds to operation 608, where the circuit description (e.g. HDL code) is utilized to generate an SDL that includes the circuit implementation defined by the circuit description. The routine 600 then proceeds from operation 608 to operation 610, where it ends.

Figure 7:
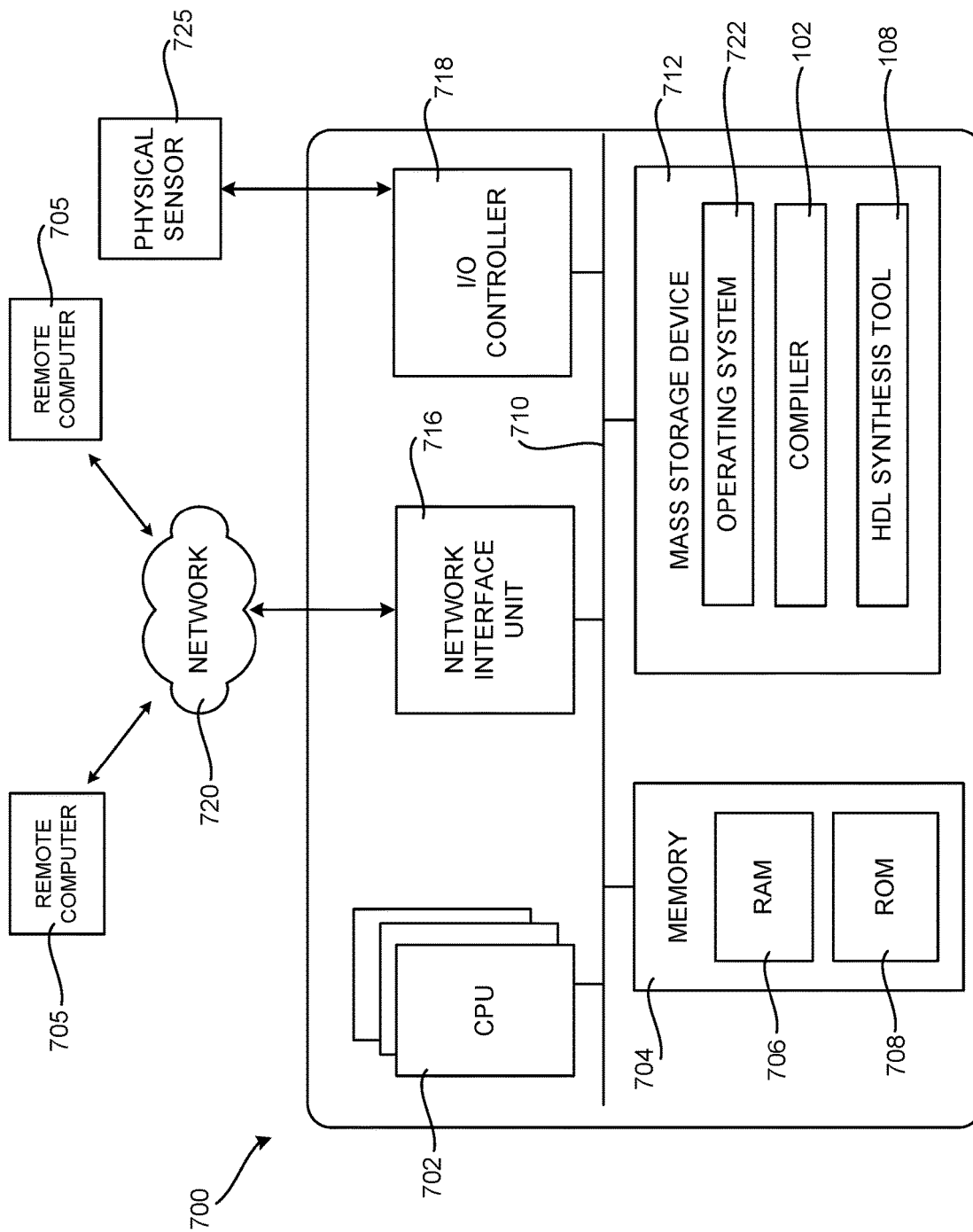
FIG. 7 is a computer architecture diagram showing an illustrative computer hardware and software architecture for a computing device that can implement aspects of the technologies presented herein.

FIG. 7 is a computer architecture diagram showing an illustrative computer hardware and software architecture for a computing device that can implement the various technologies presented herein. In particular, the architecture illustrated in FIG. 7 can be utilized to implement a server computer, mobile phone, an e-reader, a smartphone, a desktop computer, an AR/VR device, a tablet computer, a laptop computer, or another type of computing device.

The computer 700 illustrated in FIG. 7 includes a central processing unit 702 ("CPU"), a system memory 704, including a random-access memory 706 ("RAM") and a read-only memory ("ROM") 708, and a system bus 710 that couples the memory 704 to the CPU 702. A basic input/output system ("BIOS" or "firmware") containing the basic routines that help to transfer information between elements within the computer 700, such as during startup, can be stored in the ROM 708. The computer 700 further includes a mass storage device 712 for storing an operating system 722, application programs, and other types of programs. The mass storage device 712 can also be configured to store other types of programs and data.

The mass storage device 712 is connected to the CPU 702 through a mass storage controller (not shown) connected to the bus 710. The mass storage device 712 and its associated computer readable media provide non-volatile storage for the computer 700. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 700.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 700. For purposes of the claims, the phrase "computer storage medium," and variations thereof, does not include waves or signals per se or communication media.

According to various configurations, the computer 700 can operate in a networked environment using logical connections to remote computers through a network such as the network 720. The computer 700 can connect to the network 720 through a network interface unit 716 connected to the bus 710. It should be appreciated that the network interface unit 716 can also be utilized to connect to other types of networks and remote computer systems. The computer 700 can also include an input/output controller 718 for receiving and processing input from a number of other devices, including a keyboard, mouse, touch input, an electronic stylus (not shown in FIG. 7), or a physical sensor such as a video camera. Similarly, the input/output controller 718 can provide output to a display screen or other type of output device (also not shown in FIG. 7).

It should be appreciated that the software components described herein, when loaded into the CPU 702 and executed, can transform the CPU 702 and the overall computer 700 from a general-purpose computing device into a special-purpose computing device customized to facilitate the functionality presented herein. The CPU 702 can be constructed from any number of transistors or other discrete circuit elements, which can individually or collectively assume any number of states. More specifically, the CPU 702 can operate as a finite-state machine, in response to executable instructions contained within the software modules disclosed herein. These computer-executable instructions can transform the CPU 702 by specifying how the CPU 702 transitions between states, thereby transforming the transistors or other discrete hardware elements constituting the CPU 702.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 700 in order to store and execute the software components presented herein. It also should be appreciated that the architecture shown in FIG. 7 for the computer 700, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 700 might not include all of the components shown in FIG. 7, can include other components that are not explicitly shown in FIG. 7, or can utilize an architecture completely different than that shown in FIG. 7.

Figure 8:
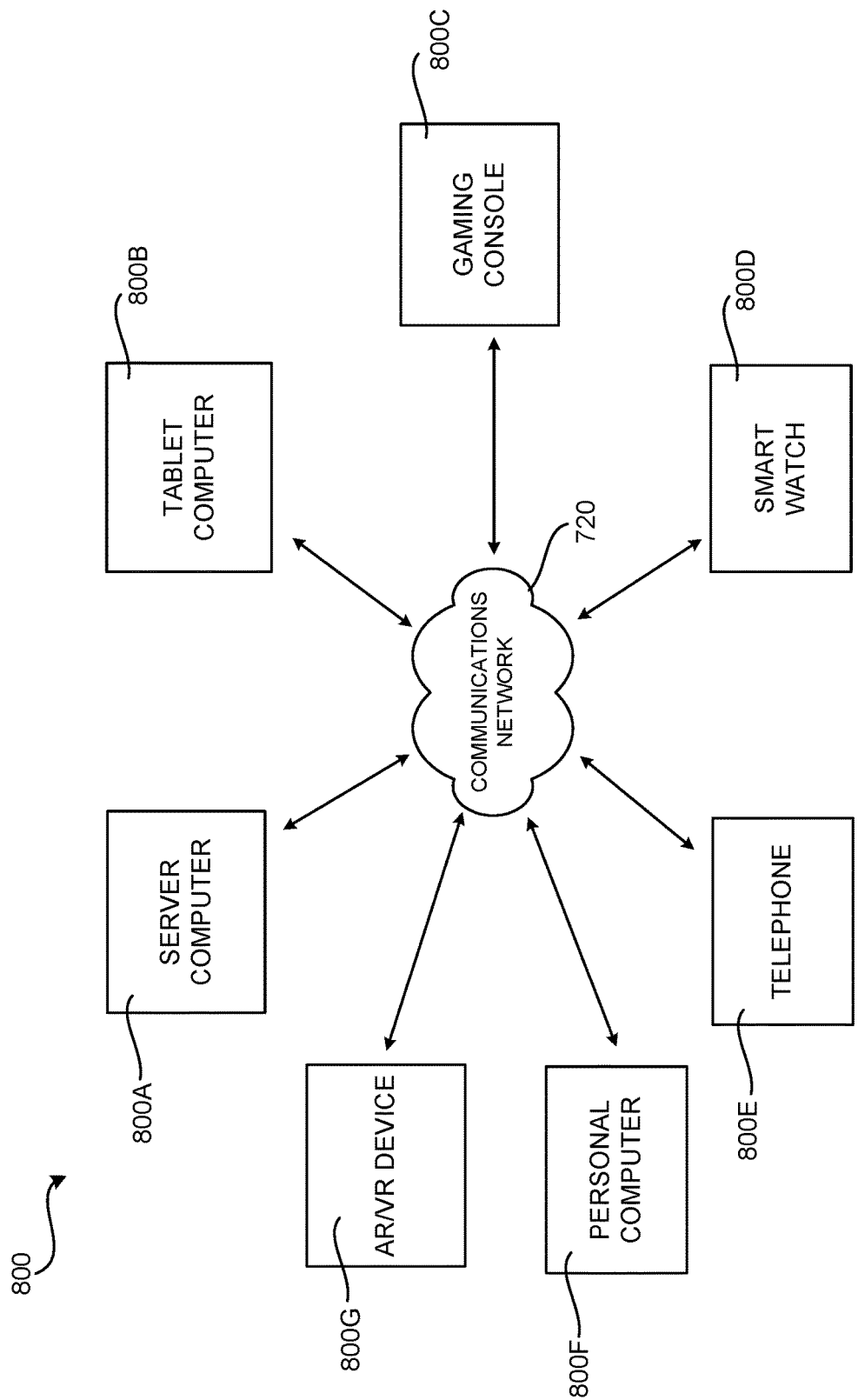
FIG. 8 is a network diagram illustrating a distributed computing environment in which aspects of the disclosed technologies can be implemented.

FIG. 8 is a network diagram illustrating a distributed network computing environment 800 in which aspects of the disclosed technologies can be implemented, according to various embodiments presented herein. As shown in FIG. 8, one or more server computers 800A can be interconnected via a communications network 720 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 800B, a gaming console 800C, a smart watch 800D, a telephone 800E, such as a smartphone, a personal computer 800F, and an AR/VR device 800G.

In a network environment in which the communications network 720 is the Internet, for example, the server computer 800A can be a dedicated server computer operable to process and communicate data to and from the client computing devices 800B-800G via any of a number of known protocols, such as, hypertext transfer protocol ("HTTP"), file transfer protocol ("FTP"), or simple object access protocol ("SOAP"). Additionally, the networked computing environment 800 can utilize various data security protocols such as secured socket layer ("SSL") or pretty good privacy ("PGP"). Each of the client computing devices 800B-800G can be equipped with an operating system operable to support one or more computing applications or terminal sessions such as a web browser (not shown in FIG. 8), or other graphical user interface (not shown in FIG. 8), or a mobile desktop environment (not shown in FIG. 8) to gain access to the server computer 800A.

The server computer 800A can be communicatively coupled to other computing environments (not shown in FIG. 8) and receive data regarding a participating user's interactions/resource network. In an illustrative operation, a user (not shown in FIG. 8) may interact with a computing application running on a client computing device 800B-800G to obtain desired data and/or perform other computing applications.

The data and/or computing applications may be stored on the server 800A, or servers 800A, and communicated to cooperating users through the client computing devices 800B-800G over an exemplary communications network 720. A participating user (not shown in FIG. 8) may request access to specific data and applications housed in whole or in part on the server computer 800A. These data may be communicated between the client computing devices 800B-800G and the server computer 800A for processing and storage.

The server computer 800A can host computing applications, processes and applets for the generation, authentication, encryption, and communication of data and applications, and may cooperate with other server computing environments (not shown in FIG. 8), third party service providers (not shown in FIG. 8), network attached storage ("NAS") and storage area networks ("SAN") to realize application/data transactions.

It should be appreciated that the computing architecture shown in FIG. 7 and the distributed network computing environment shown in FIG. 8 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1: A computer-implemented method, comprising: receiving source code expressed in a multi-threaded programming language, the source code comprising a construct that maps to a circuit implementation, the construct comprising a loop statement that comprises a body that iterates until a condition is met, wherein the circuit implementation comprises: a hardware pipeline implementing the body of the loop, wherein the hardware pipeline receives an input from a first queue, wherein the hardware pipeline provides a first output to a second queue when the condition is not met, wherein the second queue provides the first output to the hardware pipeline for a subsequent iteration, and wherein the hardware pipeline provides a second output to a third queue when the condition is met; compiling the source code to a circuit description; and generating, based on the circuit description, a synchronous digital circuit comprising the circuit implementation.

Clause 2: The computer-implemented method of clause 1, wherein the first input, the first output, and the second output each comprise collections of local variables associated with a thread.

Clause 3: The computer-implemented method of any of clauses 1-2, wherein the hardware pipeline comprises a plurality of stages, and wherein the thread executes one of the plurality of stages in a single clock cycle.

Clause 4: The computer-implemented method of any of clauses 1-3, wherein a single thread may enter the hardware pipeline per clock cycle, and wherein the hardware pipeline implements a policy circuit that determines whether to allow a thread from the first queue or the second queue to enter the pipeline on a given clock cycle.

Clause 5: The computer-implemented method of any of clauses 1-4, wherein a plurality of threads are allowed to enter the hardware pipeline, and wherein the plurality of threads execute within the pipeline in parallel.

Clause 6: The computer-implemented method of any of clauses 1-5, wherein the policy circuit limits a number of threads allowed within the pipeline to a capacity of the second queue.

Clause 7: The computer-implemented method of any of clauses 1-6, wherein the loop comprises a for-loop, a while-loop, a do-while-loop, or tail recursion.

Clause 8: A computing device comprising: one or more processors; and at least one computer storage medium having computer executable instructions stored thereon which, when executed by the one or more processors, cause the computing device to: receive source code expressed in a multi-threaded programming language, the source code comprising a construct that maps to a circuit implementation, the circuit implementation including a pipeline that is part of a call graph cycle, wherein the pipeline receives input from a queue that provides an initial collection of local variables associated with a thread and a queue that provides one or more subsequent collections of local variables associated with the thread, and wherein a policy circuit of the pipeline limits a number of threads allowed to execute within the pipeline to a capacity of the queue that provides one or more subsequent collections of local variables associated with the thread; compile the construct to a circuit description; and generate, based on the circuit description, a synchronous digital circuit comprising the circuit implementation.

Clause 9: The computing device of clause 8, wherein the pipeline limits the number of threads allowed to execute within the pipeline by incrementing a counter when a thread enters the pipeline, decrementing the counter when the thread exits the pipeline on an execution path that is not part of the call graph cycle, and allowing a thread to enter the pipeline when the counter is less than the capacity of the queue that provides one or more subsequent collections of local variables associated with the thread.

Clause 10: The computing device of any of clauses 8-9, wherein the pipeline and the queue that provides the pipeline with one or more subsequent collections of local variables associated with the thread is associated with a loop construct defined in the source code.

Clause 11: The computing device of any of clauses 8-10, wherein the pipeline and the queue that provides the pipeline with one or more subsequent collections of local variables associated with the thread is associated with a first function that invokes a second function at least two times.

Clause 12: The computing device of any of clauses 8-11, wherein the queue that provides the pipeline with one or more subsequent collections of local variables associated with the thread comprises a back-link.

Clause 13: The computing device of any of clauses 8-12, wherein the queue that provides the initial collection of local variables associated with the thread also provides subsequent collections of local variables associated with the thread, and wherein the number of threads allowed to execute within the pipeline is limited to the lesser of the capacity of the queue that provides the initial collection of local variables associated with the thread and the capacity of the queue that provides one or more subsequent collections of local variables associated with the thread.

Clause 14: The computing device of any of clauses 8-13, wherein the call graph cycle comprises a first function invoking a second function using a first invocation queue, wherein the second function provides a return value to the first function using a return value queue, wherein the first function invokes the second function a second time using a second invocation queue, and wherein the pipeline implements at least part of the second function.

Clause 15: At least one computer storage medium having computer executable instructions stored thereon which, when executed by one or more processors, cause a computing device to: receive source code expressed in a multi-threaded programming language, the source code comprising a construct that maps to a circuit implementation, the construct comprising a loop statement that comprises a body that iterates until a condition is met, wherein the circuit implementation comprises: a pipeline that implements the body, wherein the pipeline is part of a call graph cycle, wherein the call graph cycle begins with the pipeline receiving an initial collection of local variables from a first queue, wherein, when the condition is met, the call graph cycle continues by providing a second queue with an iteration collection of local variables from the pipeline, wherein the call graph cycle continues by the second queue providing the iteration collection of local variables to the pipeline, and wherein the call graph cycle ends when the condition is no longer met and a result collection of local variables is made available; compile the construct to a circuit description; and generate, based on the circuit description, a synchronous digital circuit comprising the circuit implementation.

Clause 16: The at least one computer storage medium of clause 15, wherein the initial collection of local variables, the iteration collection of local variables, and the result collection of local variables are associated with a thread.

Clause 17: The at least one computer storage medium of any of clauses 15-16, wherein the pipeline comprises a hardware pipeline, wherein the hardware pipeline comprises a plurality of stages, and wherein the thread executes each of the plurality of stages in a single clock cycle.

Clause 18: The at least one computer storage medium of any of clauses 15-17, wherein the pipeline comprises a policy circuit that determines for a given clock cycle whether to process a collection of variables from the first queue or the second queue.

Clause 19: The at least one computer storage medium of any of clauses 15-18, wherein a plurality of threads are allowed to enter the pipeline, and wherein the plurality of threads execute within the pipeline in parallel.

Clause 20: The at least one computer storage medium of any of clauses 15-19, wherein the policy circuit limits the number of threads allowed within the pipeline to a capacity of the second queue.

Based on the foregoing, it should be appreciated that a language and compiler that generate circuits that do not deadlock has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:
1. A computer-implemented method, comprising:
receiving source code expressed in a multi-threaded programming language, the source code comprising a construct that maps to a circuit implementation, the construct comprising a loop statement that comprises a body that iterates until a condition is met, wherein the circuit implementation comprises a hardware pipeline implementing the body of the loop statement, wherein the hardware pipeline receives an input from a first queue and provides a first output to a second queue when the condition is not met, wherein the second queue provides the first output to the hardware pipeline for a subsequent iteration, and wherein the hardware pipeline provides a second output to a third queue when the condition is met;

compiling the source code to a circuit description; and generating, based on the circuit description, a synchronous digital circuit comprising the circuit implementation.

2. The computer-implemented method of claim 1, wherein each of the first input, the first output, and the second output comprises collections of local variables associated with a thread.

3. The computer-implemented method of claim 2, wherein the hardware pipeline comprises a plurality of stages, and wherein the thread executes one of the plurality of stages in a single clock cycle.

4. The computer-implemented method of claim 3, wherein a single thread can enter the hardware pipeline per clock cycle, and wherein the hardware pipeline implements a policy circuit that determines whether to allow a thread from the first queue or the second queue to enter the hardware pipeline on a given clock cycle.

5. The computer-implemented method of claim 4, wherein a plurality of threads are allowed to enter the hardware pipeline, and wherein the plurality of threads execute within the hardware pipeline in parallel.

6. The computer-implemented method of claim 4, wherein the policy circuit limits a number of threads allowed within the hardware pipeline to a capacity of the second queue.

7. The computer-implemented method of claim 1, wherein the loop comprises a for-loop, a while-loop, a do-while-loop, or tail recursion.

8. A computing device comprising:
one or more processors; and
at least one non-transitory computer storage medium having computer executable instructions stored thereon that, when executed by the one or more processors, cause the computing device to:
receive source code expressed in a multi-threaded programming language, the source code comprising a construct that maps to a circuit implementation, wherein the circuit implementation includes a pipeline that is part of a call graph cycle, wherein the pipeline receives input from a queue that provides an initial collection of local variables associated with a thread and a queue that provides one or more subsequent collections of local variables associated with the thread, and wherein a policy circuit of the pipeline limits a number of threads allowed to execute within the pipeline to a capacity of the queue that provides one or more subsequent collections of local variables associated with the thread;
compile the construct to a circuit description; and
generate, based on the circuit description, a synchronous digital circuit comprising the circuit implementation.

9. The computing device of claim 8, wherein the pipeline limits the number of threads allowed to execute within the pipeline by incrementing a counter when a thread enters the pipeline, decrementing the counter when the thread exits the pipeline on an execution path that is not part of the call graph cycle, and allowing a thread to enter the pipeline when the counter is less than the capacity of the queue that provides one or more subsequent collections of local variables associated with the thread.

10. The computing device of claim 8, wherein the pipeline and the queue that provides the pipeline with one or more subsequent collections of local variables associated with the thread is associated with a loop construct defined in the source code.

11. The computing device of claim 8, wherein the pipeline and the queue that provides the pipeline with one or more subsequent collections of local variables associated with the thread is associated with a first function that invokes a second function at least two times.

12. The computing device of claim 8, wherein the queue that provides the pipeline with one or more subsequent collections of local variables associated with the thread comprises a back-link.

13. The computing device of claim 8, wherein the queue that provides the initial collection of local variables associated with the thread also provides subsequent collections of local variables associated with the thread, and wherein the number of threads allowed to execute within the pipeline is limited to a lesser of the capacity of the queue that provides the initial collection of local variables associated with the thread and the capacity of the queue that provides one or more subsequent collections of local variables associated with the thread.

14. The computing device of claim 8, wherein the call graph cycle comprises a first function invoking a second function using a first invocation queue, wherein the second function provides a return value to the first function using a return value queue, wherein the first function invokes the second function a second time using a second invocation queue, and wherein the pipeline implements at least part of the second function.

15. At least one non-transitory computer storage medium having computer executable instructions stored thereon that, when executed by one or more processors, cause a computing device to:
receive source code expressed in a multi-threaded programming language, the source code comprising a construct that maps to a circuit implementation, the construct comprising a loop statement that comprises a body that iterates until a condition is met, wherein the circuit implementation comprises a pipeline that implements the body, wherein the pipeline is part of a call graph cycle, wherein the call graph cycle begins with the pipeline receiving an initial collection of local variables from a first queue, wherein, when the condition is met, the call graph cycle continues by providing a second queue with an iteration collection of local variables from the pipeline, wherein the call graph cycle continues by the second queue providing the iteration collection of local variables to the pipeline, and wherein the call graph cycle ends when the condition is no longer met and a result collection of local variables is made available;
compile the construct to a circuit description; and
generate, based on the circuit description, a synchronous digital circuit comprising the circuit implementation.

16. The at least one non-transitory computer storage medium of claim 15, wherein the initial collection of local variables, the iteration collection of local variables, and the result collection of local variables are associated with a thread.

17. The at least one non-transitory computer storage medium of claim 16, wherein the pipeline comprises a hardware pipeline, wherein the hardware pipeline comprises a plurality of stages, and wherein the thread executes each of the plurality of stages in a single clock cycle.

18. The at least one non-transitory computer storage medium of claim 17, wherein a plurality of threads are allowed to enter the pipeline, and wherein the plurality of threads execute within the pipeline in parallel.

19. The at least one non-transitory computer storage medium of claim 15, wherein the pipeline comprises a policy circuit that determines for a given clock cycle whether to process a collection of variables from the first queue or the second queue.

20. The at least one non-transitory computer storage medium of claim 19, wherein the policy circuit limits a number of threads allowed within the pipeline to a capacity of the second queue.

* * * * *